(12) United States Patent
Jung

(10) Patent No.: US 9,576,628 B1
(45) Date of Patent: Feb. 21, 2017

(54) SEMICONDUCTOR DEVICE

(71) Applicant: SK hynix Inc., Icheon-si Gyeonggi-do (KR)

(72) Inventor: Ho Don Jung, Seoul (KR)

(73) Assignee: SK HYNIX INC., Icheon-si (KR)

( * ) Notice: Subject to any disclaimer, the term of this patent is extended or adjusted under 35 U.S.C. 154(b) by 0 days.

(21) Appl. No.: 15/193,458

(22) Filed: Jun. 27, 2016

(30) Foreign Application Priority Data

Mar. 31, 2016 (KR) ........................ 10-2016-0039090

(51) Int. Cl.
*G11C 5/14* (2006.01)
*G11C 7/22* (2006.01)
*G11C 7/10* (2006.01)
*G11C 7/12* (2006.01)

(52) U.S. Cl.
CPC . *G11C 7/22* (2013.01); *G11C 5/14* (2013.01); *G11C 7/10* (2013.01); *G11C 7/12* (2013.01)

(58) Field of Classification Search
CPC .............. G11C 8/08; G11C 5/14; G11C 5/148
USPC ................ 365/226, 227, 193, 233.1
See application file for complete search history.

(56) References Cited

U.S. PATENT DOCUMENTS

| 6,581,843 | B2 | 6/2003 | Nobukata | |
|---|---|---|---|---|
| 2009/0303796 | A1* | 12/2009 | Abe | G11C 7/06 365/185.17 |
| 2015/0124536 | A1* | 5/2015 | Jung | G11C 7/222 365/189.05 |
| 2015/0378603 | A1* | 12/2015 | Dearth | G06F 13/4072 711/154 |

FOREIGN PATENT DOCUMENTS

KR 1020150108174 A 9/2015

* cited by examiner

*Primary Examiner* — Han Yang
(74) *Attorney, Agent, or Firm* — William Park & Associates Ltd.

(57) ABSTRACT

A semiconductor device may include a driving control signal generation circuit configured to generate a driving control signal by determining whether a corresponding operation is a gapless read operation, according to a read strobe signal. The semiconductor device may also include a power driving circuit configured to drive a supply voltage to a power supply voltage in response to the driving control signal, and a read control signal generation circuit configured to generate a read control signal for controlling a read operation from the read strobe signal in response to the supply voltage.

20 Claims, 8 Drawing Sheets

SEMICONDUCTOR DEVICE

CROSS-REFERENCES TO RELATED APPLICATIONS

The present application claims priority under 35 U.S.C. §119(a) to Korean application number 10-2016-0039090, filed on Mar. 31, 2016, which is incorporated by reference in its entirety.

BACKGROUND OF THE INVENTION

1. Technical Field

The present invention relates to a semiconductor device which is capable of stably operating even though the level of a power supply voltage decreases.

2. Related Art

Recently, a semiconductor device was designed to perform a gapless operation in which a command continuously toggles to accomplish a high-speed operation. The gapless operation may include a gapless read operation in which a read command successively toggles without a gap, a gapless write operation in which a write command successively toggles without a gap, a gapless active operation in which an active command successively toggles without a gap, and a gapless precharge operation in which a precharge command successively toggles without a gap.

When a gapless operation is performed, an excessive amount of current may be consumed, and a level of a power supply voltage may be decreased.

SUMMARY OF THE INVENTION

Embodiments of the present disclosure are directed to a semiconductor device which is capable of operating even though a gapless operation is performed to reduce the level of a power supply voltage.

In one embodiment, a semiconductor device may include a driving control signal generation circuit configured to generate a driving control signal by determining whether a corresponding operation is a gapless read operation, according to a read strobe signal. The semiconductor device may also include a power driving circuit configured to drive a supply voltage to a power supply voltage in response to the driving control signal, and a read control signal generation circuit configured to generate a read control signal for controlling a read operation from the read strobe signal in response to the supply voltage.

In another embodiment, a semiconductor device may include a power driving circuit configured to drive a supply voltage to a power supply voltage, and short a first node to which the power supply voltage is supplied and a second node from which the supply voltage is outputted, in response to a driving control signal that is enabled when the number of pulses of a read strobe signal, which are generated during a preset section, is equal to or more than a preset number. The semiconductor device may also include a read control signal generation circuit configured to generate a read control signal for controlling a read operation from the read strobe signal in response to the supply voltage.

In another embodiment, a semiconductor device may include a driving control signal generation circuit configured to generate a driving control signal by determining whether one of a gapless active operation, a gapless write operation, and a gapless precharge operation is performed, according to a strobe signal. The semiconductor device may also include a power driving circuit configured to drive a supply voltage to a power supply voltage in response to the driving control signal, and a control signal generation circuit configured to generate a read control signal for controlling an internal command where the control signal is generated from the strobe signal in response to the supply voltage.

DESCRIPTION OF SPECIFIC EMBODIMENTS

Embodiments will hereinafter be described in detail with reference to the accompanying drawings. It should be noted that the drawings are not to precise scale and may be exaggerated in thickness of lines or sizes of components for descriptive convenience and clarity only. Furthermore, the terms as used herein are defined by taking functions of the disclosure into account and can be changed according to the custom or intention of users or operators. Therefore, definition of the terms should be made according to the overall disclosures set forth herein.

Figure 1:
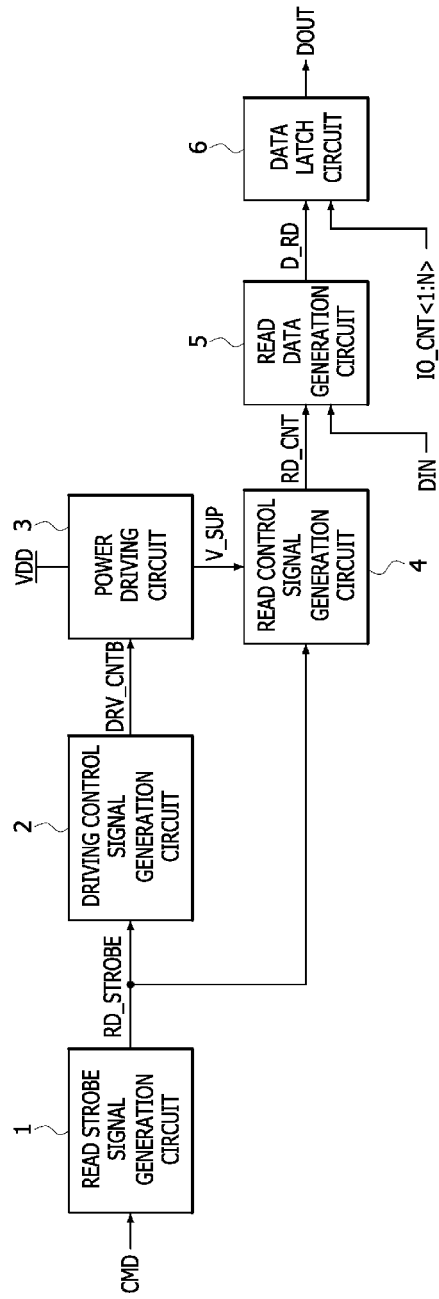
FIG. 1 a block diagram illustrating a configuration of a semiconductor device in accordance with an embodiment.

As illustrated in FIG. 1, a semiconductor device in accordance with an embodiment may include a read strobe signal generation circuit 1, a driving control signal generation circuit 2, a power driving circuit 3, a read control signal generation circuit 4, a read data generation circuit 5, and a data latch circuit 6.

The read strobe signal generation circuit 1 may generate a read strobe signal RD_STROBE in response to a command CMD. More specifically, the read strobe signal generation circuit 1 may generate the read strobe signal RD_STROBE by decoding the command CMD. The command CMD may be inputted from outside the semiconductor device. The read strobe signal RD_STROBE may include an internal command containing pulses which are generated to perform a read operation. The read strobe signal RD_STROBE may be generated as a signal containing pulses which are periodically generated to perform successive read operations.

The driving control signal generation circuit 2 may generate a driving control signal DRV_CNTB in response to the read strobe signal RD_STROBE. More specifically, the driving control signal generation circuit 2 may generate the driving control signal DRV_CNTB which is enabled when a corresponding read operation is determined to be a gapless read operation according to the read strobe signal RD_STROBE. When the number of pulses contained in the read strobe signal RD_STROBE and generated during a preset section is equal to or more than a preset number, the driving control signal generation circuit 2 may determine that the corresponding read operation is a gapless read operation.

The power driving circuit 3 may drive a supply voltage V_SUP to a power supply voltage VDD in response to the driving control signal DRV_CNTB. More specifically, when the driving control signal DRV_CNTB is enabled, the power driving circuit 3 may drive the supply voltage V_SUP to a higher level than when the driving control signal DRV_CNTB is disabled. That is, the power driving circuit 3 may be configured to increase a level of the supply voltage V_SUP, when the corresponding read operation is determined to be a gapless read operation.

The read control signal generation circuit 4 may generate a read control signal RD_CNT for controlling a read operation, where the read control signal RD_CNT is generated from the read strobe signal RD_STROBE in response to the supply voltage V_SUP. More specifically, the read control signal generation circuit 4 may include one or more buffers which are driven by the supply voltage V_SUP, and generate the read control signal RD_CNT by buffering the read strobe signal RD_STROBE. Pulses contained in the read control signal RD_CNT may have a pulse width that decreases as the level of the supply voltage V_SUP rises.

The read data generation circuit 5 may generate read data D_RD from input data DIN in response to the read control signal RD_CNT. More specifically, the read data generation circuit 5 may output the input data DIN as the read data D_RD in synchronization with a pulse contained in the read control signal RD_CNT.

The data latch circuit 6 may latch the read data D_RD in response to an input/output control signal IO_CNT<1:N>, and output the latched read data D_RD as output data DOUT. The input/output control signal IO_CNT<1:N> may include a signal for controlling an input of the read data D_RD and a signal for controlling an output of the read data D_RD. The data latch circuit 6 may be implemented with a pipe latch circuit.

Figure 2:
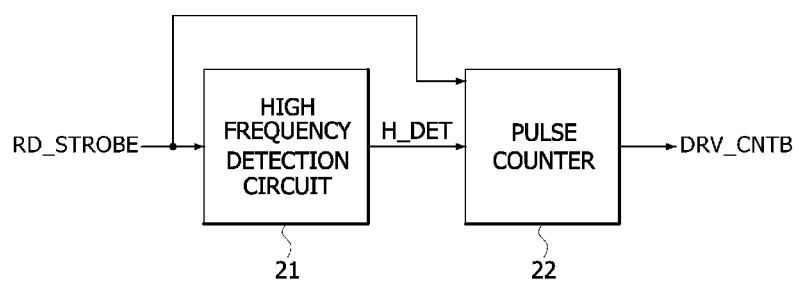
FIG. 2 is a block diagram illustrating a configuration of a driving control signal generation circuit included in the semiconductor device illustrated in FIG. 1.

Referring to FIG. 2, the driving control signal generation circuit 2 may include a high frequency detection circuit 21 and a pulse counter 22.

The high frequency detection circuit 21 may detect whether the read strobe signal RD_STROBE is a high frequency signal, and generate a high frequency detection signal H_DET when the high frequency detection circuit 21 determines when the read strobe signal RD_STROBE signal is determined to be a high frequency. More specifically, the high frequency detection circuit 21 may generate the high frequency detection signal H_DET which is enabled when the period of the read strobe signal RD_STROBE is equal to or more than a preset frequency.

The pulse counter 22 may generate the driving control signal DRV_CNTB in response to the high frequency detection signal H_DET and by counting the number of pulses included in the read strobe signal RD_STROBE. More specifically, the pulse counter 22 may generate the driving control signal DRV_CNTB which is enabled when the number of pulses contained in the read strobe signal RD_STROBE generated during a preset section is equal to or more than a preset number in a state where the high frequency detection signal H_DET is enabled.

Figure 3:
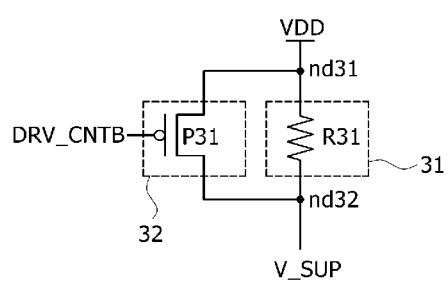
FIG. 3 is a circuit diagram of a power driving circuit included in the semiconductor device illustrated in FIG. 1.

Referring to FIG. 3, the power driving circuit 3 may include a voltage dropping element or resistor 31 and a short control element or transistor 32. The voltage dropping element 31 may include a resistor R31 coupled between a node nd31 to which the power supply voltage VDD is supplied, and a node nd32 from which the supply voltage V_SUP is outputted. The voltage dropping element 31 may be implemented with a MOS transistor depending on an embodiment. The short control element 32 may include a PMOS transistor P31 coupled between the node nd31 to which the power supply voltage VDD is supplied and the node nd32 from which the supply voltage V_SUP is outputted. The short control element 32 may short the node nd31 and the node nd32 to each other through the PMOS transistor P31 which is turned on when the driving control signal DRV_CNTB is enabled to a logic low level.

Figure 4:
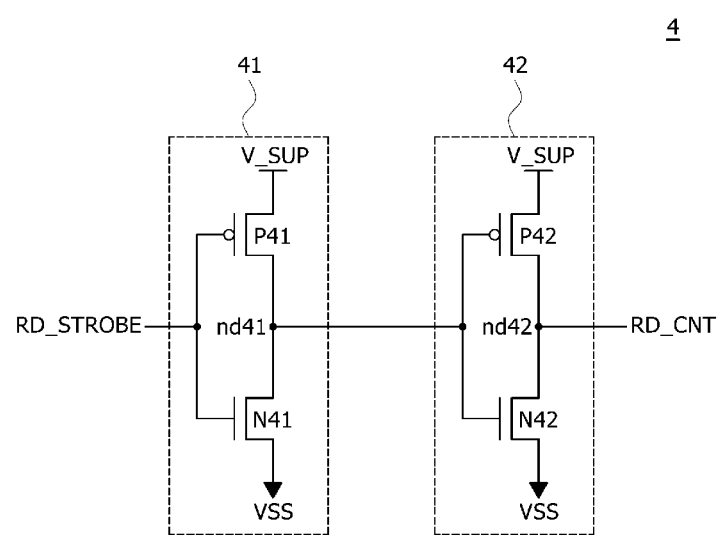
FIG. 4 is a circuit diagram of a read control signal generation circuit included in the semiconductor device illustrated in FIG. 1.

Referring to FIG. 4, the read control signal generation circuit 4 may include a first buffer 41 and a second buffer 42. The first buffer 41 may include a PMOS transistor P41 and an NMOS transistor N41. The PMOS transistor P41 may be coupled between the supply voltage V_SUP and a node nd41, and operate as a pull-up element for pull-up driving the node nd41 in response to the read strobe signal RD_STROBE. The NMOS transistor N41 may be coupled between the node nd41 and a ground voltage VSS, and operate as a pull-down element for pull-down driving the node nd41 in response to the read strobe signal RD_STROBE. The first buffer 41 may invert and buffer the read strobe signal RD_STROBE and output the inverted and buffered signal to the node nd41. The second buffer 42 may include a PMOS transistor P42 and an NMOS transistor N42. The PMOS transistor P42 may be coupled between the supply voltage V_SUP and a node nd42 which may function as an output node, and operate as a pull-up element for pull-up driving the node nd42 in response to the signal received from the node nd41 which may function as an input node. The NMOS transistor N42 may be coupled between the node nd42 and the ground voltage VSS, and operate as a pull-down element for pull-down driving the node nd42 in response to the signal received from the node nd41. The second buffer 42 may invert and buffer the signal received from the node nd41 and output the inverted and buffered signal as the read control signal RD_CNT through the node nd42.

Operation of a semiconductor device having the above-described configuration will be described with reference to FIGS. 5 and 6.

Figure 5:
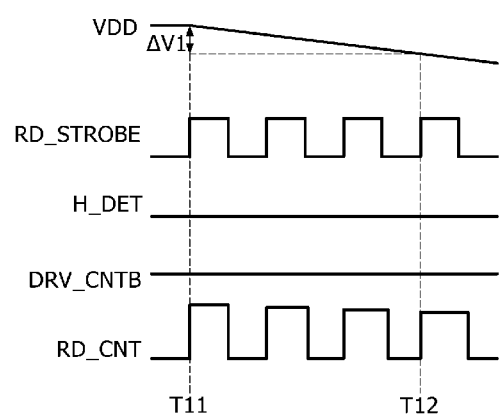
FIGS. 5 and 6 are timing diagrams for describing operation of the semiconductor device illustrated in FIG. 1.

As illustrated in FIG. 5, when the number of pulses of the read strobe signal RD_STROBE during a preset section T11 to T12 is less than a preset number (for example, 5), the semiconductor device may be in a state in which a gapless read operation is not performed. Since the level of the power supply voltage VDD is reduced by $\Delta V1$ during the section T11 to T12 in which a gapless read operation is not performed, a pulse width of the read control signal RD_CNT may possibly not be increased to such an extent that a malfunction occurs. Thus, at a time point T12 of the section T11 to T12 in which a gapless read operation is not performed has ended, the high frequency detection signal H_DET may maintain a state in which the high frequency detection signal H_DET is disabled to a logic low level, and the driving control signal DRV_CNTB may maintain a state in which the driving control signal DRV_CNTB is disabled to a logic high level.

Figure 6:
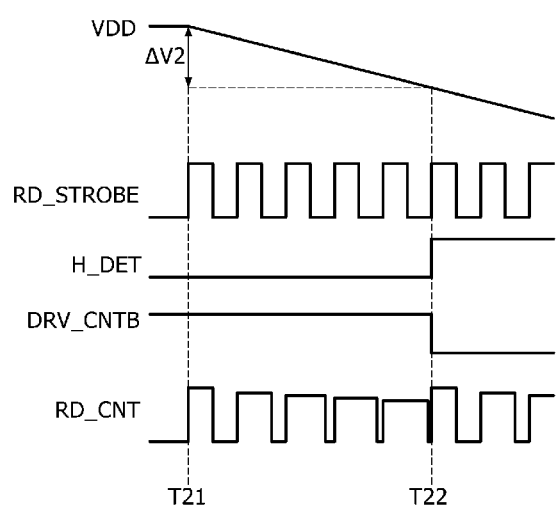

As illustrated in FIG. 6, when the number of pulses of the read strobe signal RD_STROBE during a preset section T21 to T22 is equal to or more than the preset number (for example, 5), the semiconductor device may be in a state in which a gapless read operation is performed. During the section T21 to T22 in which a gapless read operation is performed, the level of the power supply voltage VDD may be reduced by $\Delta V2$. At this time, $\Delta V2$ may be set to be larger than $\Delta V1$ in FIG. 5. During the section T21 to T22 in which a gapless read operation is performed, a pulse width of the read control signal RD_CNT may be increased to such an extent that a malfunction occurs. That is, when the pulse width of the read control signal RD_CNT is increased even after the time point T22, pulses included in the read control signal RD_CNT may disappear to cause a malfunction. Thus, at the time point T22 of the section T21 to T22 in which a gapless read operation is performed has ended, the high-frequency detection signal H_DET may transition from a logic low level to a logic high level, and the driving control signal DRV_CNTB may transition from a logic high level to a logic low level. Then, the pulse width of the read control signal RD_CNT may be reduced in order to prevent a malfunction. In order to reduce the pulse width of the read control signal RD_CNT, drivability for driving the read control signal RD_CNT may be increased by the driving control signal DRV_CNTB enabled to a logic low level.

As described above, when a gapless read operation is performed, the semiconductor device in accordance with the present embodiment may raise the level of the supply voltage V_SUP which drives the read control signal RD_CNT for controlling the read operation, thereby suppressing the increase in a pulse width of pulses included in the read control signal RD_CNT. As the gapless read operation is performed, the level of the power supply voltage VDD may be rapidly decreased, but the decrease in the level of the supply voltage V_SUP driven to the power supply voltage VDD may be suppressed. Thus, the increase in the pulse width of pulses included in the read control signal RD_CNT may be suppressed. Therefore, the semiconductor device in accordance with the present embodiment can prevent a malfunction which occurs as the pulses contained in the read control signal RD_CNT disappear when the pulse width of the pulses contained in the read control signal RD_CNT is increased according to the rapid reduction of the power supply voltage level during a gapless read operation.

Figure 7:
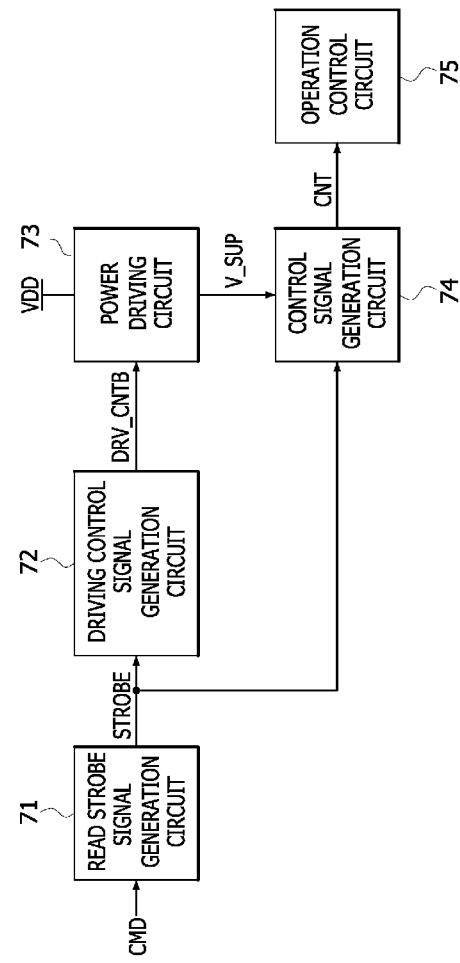
FIG. 7 is a block diagram illustrating a configuration of a semiconductor device in accordance with another embodiment.

As illustrated in FIG. 7, a semiconductor device in accordance with another embodiment may include a strobe signal generation circuit 71, a driving control signal generation circuit 72, a power driving circuit 73, a control signal generation circuit 74, and an operation control circuit 75.

The strobe signal generation circuit 71 may generate a strobe signal STROBE in response to a command CMD. More specifically, the strobe signal generation circuit 71 may generate the strobe signal STROBE by decoding the command CMD. The command CMD may be inputted from outside the semiconductor device. The strobe signal STROBE may include an internal command containing pulses which are generated to perform one of an active operation, a write operation, and a precharge operation. The strobe signal STROBE may be generated as a signal containing pulses which are periodically generated to perform one of a successive active operation, write operation, and precharge operation.

The driving control signal generation circuit 72 may generate a driving control signal DRV_CNTB in response to the strobe signal STROBE. More specifically, the driving control signal generation circuit 72 may generate the driving control signal DRV_CNTB which is enabled when the corresponding operation is determined to be one of a gapless active operation, a gapless write operation, or a gapless precharge operation, according to the strobe signal STROBE. The driving control signal generation circuit 72 may determine that the corresponding operation is one of a gapless active operation, a gapless write operation, and a gapless precharge operation, when the number of pulses contained in the strobe signal STROBE and generated during a preset section is equal to or more than a preset number.

The power driving circuit 73 may drive a supply voltage V_SUP to a power supply voltage VDD in response to the driving control signal DRV_CNTB. More specifically, when the driving control signal DRV_CNTB is enabled, the power driving circuit 73 may drive the supply voltage V_SUP to a higher level than when the driving control signal DRV_CNTB is disabled. That is, the power driving circuit 73 may be configured to raise the level of the supply voltage V_SUP, when the corresponding operation is determined to be one of a gapless active operation, a gapless write operation, and a gapless precharge operation.

The control signal generation circuit 74 may generate a control signal CNT for controlling an internal operation from the strobe signal STROBE in response to the supply voltage V_SUP. The internal operation may comprise an active operation, a write operation and a precharge operation. More specifically, the control signal generation circuit 74 may include one or more buffers which are driven by the supply voltage V_SUP, and the control signal generation circuit 74 may generate the control signal CNT by buffering the strobe signal STROBE. Pulses contained in the control signal CNT may have a pulse width which decreases as the level of the supply voltage V_SUP rises.

The operation control circuit 75 may control one of the active operation, the write operation, and the precharge operation in response to the control signal CNT. For example, when the control signal CNT is enabled, the operation control circuit 75 may perform a control operation to activate an address decoding operation during an active operation or activate a data input operation during a write operation.

As described above, when one of a gapless active operation, a gapless write operation, and a gapless precharge operation is performed, the semiconductor device in accordance with the present embodiment may increase the level of the supply voltage V_SUP which drives the control signal CNT for controlling one of an active operation, a write operation, and a precharge operation, thereby suppressing an increase in pulse width of the pulses contained in the control signal CNT. As one of a gapless active operation, a gapless write operation, and a gapless precharge operation is performed, the level of the power supply voltage VDD may be rapidly decreased, but the decrease in the level of the supply voltage V_SUP driven to the power supply voltage VDD may be suppressed. Thus, the increase in the pulse width of the pulses included in the control signal CNT may be suppressed. Therefore, the semiconductor device in accordance with the present embodiment can prevent a malfunction which occurs as the pulses contained in the control signal CNT disappear when the pulse width of the pulses contained in the control signal CNT is increased due to the rapid reduction in the level of the power supply voltage VDD during one of a gapless active operation, a gapless write operation, and a gapless precharge operation.

The semiconductor device which has been described with reference to FIGS. 1 to 7 may be applied to electronic systems including a memory system, a graphic system, a computing system, and a mobile system. For example, referring to FIG. 8, an electronic system 1000 in accordance with an embodiment may include a data storage unit or data storage 1001, a memory controller 1002, a buffer memory 1003, and an input/output interface 1004.

The data storage unit 1001 may store data applied from the memory controller 1002, read the stored data, and output the read data to the memory controller 1002, according to a control signal from the memory controller 1002. The data storage unit 1001 may include the semiconductor device illustrated in FIGS. 1 and 7. The data storage unit 1001 may include a nonvolatile memory which can continuously store data stored therein even though power supply is cut off. The nonvolatile memory may include flash memory (Nor Flash Memory, NAND Flash Memory), PRAM (Phase Change Random Access Memory), RRAM (Resistive Random Access Memory), STTRAM (Spin Transfer Torque Random Access Memory), and MRAM (Magnetic Random Access Memory).

Figure 8:
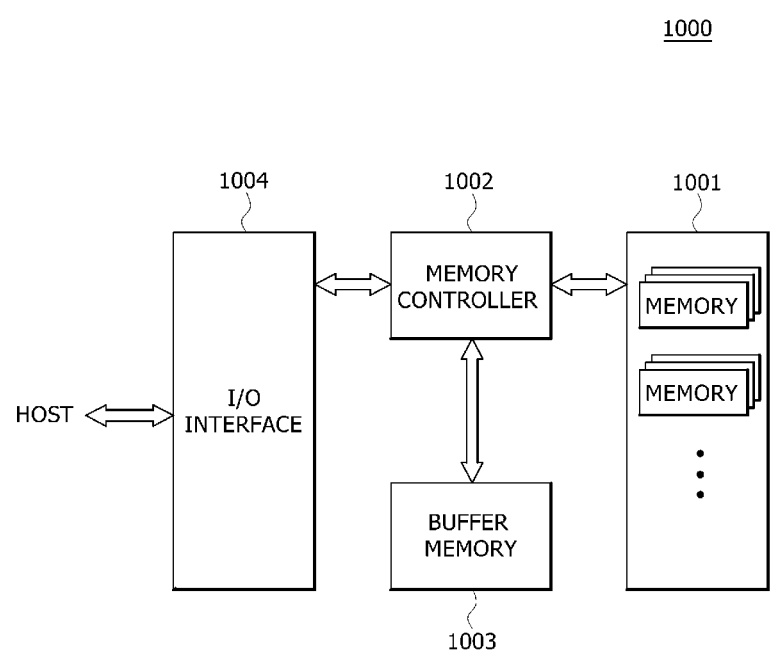
FIG. 8 is a diagram illustrating a configuration of an electronic system to which the semiconductor device illustrated in FIGS. 1 to 7 is applied.

The memory controller 1002 may decode a command applied from an external device (host device) through the input/output interface 1004, and control the data input/output for the data storage unit 1001 and the buffer memory 1003 according to the decoding result. In FIG. 8, the memory controller 1002 is represented by one block. However, the memory controller 1002 may separately include a controller for controlling the data storage unit 1001 and a controller for controlling the buffer memory 1003 which is a volatile memory.

The buffer memory 1003 may temporarily store data to be processed by the memory controller 1002, that is, data inputted to or outputted from the data storage unit 1001. The buffer memory 1003 may store data DATA applied form the memory controller 1002 according to the control signal. The buffer memory 1003 may read the stored data and output the read data to the memory controller 1002. The buffer memory 1003 may include a volatile memory such as DRAM (Dynamic Random Access Memory), mobile DRAM, or SRAM (Static Random Access Memory).

The input/output interface 1004 may provide a physical connection between the memory controller 1002 and an external device (host), and receive a control signal for controlling the memory controller 1002 to input or output data to or from the external device, and to exchange data with the external device. The input/output interface 1004 may include one of various interface protocols such as USB, MMC, PCI-E, SAS, SATA, PATA, SCSI, ESDI, and IDE.

The electronic system 1000 may be used as a secondary memory device or external storage device of the host device. The electronic system 1000 may include an SSD (Solid State Disk), a USB (Universal Serial Bus) memory, an SD (Secure Digital) card, an mSD (mini Secure Digital) card, a micro SD card, an SDHC (Secure Digital High Capacity) card, a memory stick card, an SM (Smart Media) card, an MMC (Multi Media Card), an eMMC (Embedded MMC), and a CF (Compact Flash) card.

In accordance with the present embodiments, when the corresponding operation is determined to be a gapless operation, the semiconductor device may increase the level of the supply voltage supplied to the pulse transmission circuit, and stably retain the pulse width of a signal for controlling a read operation, a write operation, an active operation, and a precharge operation, thereby preventing a malfunction which occurs when the level of the power supply voltage is lowered during the gapless operation.

Although preferred embodiments of the disclosure have been disclosed for illustrative purposes, those skilled in the art will appreciate that various modifications, additions, and substitutions are possible, without departing from the scope and spirit of the disclosure as defined in the accompanying claims.

What is claimed is:

1. A semiconductor device comprising:
   a driving control signal generation circuit configured to generate a driving control signal by determining whether a corresponding operation is a gapless read operation, according to a read strobe signal;
   a power driving circuit configured to drive a supply voltage to a power supply voltage in response to the driving control signal; and
   a read control signal generation circuit configured to generate a read control signal for controlling a read operation from the read strobe signal in response to the supply voltage.

2. The semiconductor device of claim 1, wherein the read strobe signal contains pulses which are generated to perform a read operation.

3. The semiconductor device of claim 1, wherein the driving control signal generation circuit generates the driving control signal that is enabled when the number of pulses of the read strobe signal, which are generated during a preset section, is equal to or more than a preset number.

4. The semiconductor device of claim 1, wherein the driving control signal generation circuit comprises:
   a high frequency detection circuit configured to generate a high frequency detection signal by determining whether the read strobe signal is a high frequency signal; and
   a pulse counter configured to generate the driving control signal by counting the number of pulses contained in the read strobe signal in response to the high frequency detection signal.

5. The semiconductor device of claim 1, wherein when the driving control signal is enabled, the power driving circuit drives the supply voltage to a higher level than when the driving control signal is disabled.

6. The semiconductor device of claim 1, wherein the power driving circuit comprises:
   a voltage dropping element coupled between a first node to which the power supply voltage is supplied and a second node from which the supply voltage is outputted; and
   a short control element coupled between the first and second nodes, and turned on in response to the driving control signal.

7. The semiconductor device of claim 1, wherein the read control signal generation circuit comprises one or more buffers, and generates the read control signal by buffering the read strobe signal.

8. The semiconductor device of claim 7, wherein the buffer comprises:
   a pull-up element coupled between the supply voltage and an output node, and configured to pull-up drive the output node in response to a signal of an input node; and
   a pull-down element coupled between the output node and a ground voltage, and configured to pull-down drive the output node in response to the signal of the input node.

9. The semiconductor device of claim 1, further comprising a read data generation circuit configured to generate read data from input data in synchronization with a pulse contained in the read control signal.

10. The semiconductor device of claim 9, further comprising a data latch circuit configured to latch the read data in response to an input/output control signal, and output the latched read data as output data.

11. A semiconductor device comprising:
- a power driving circuit configured to drive a supply voltage in response to a power supply voltage, and short a first node to which the power supply voltage is supplied and a second node from which the supply voltage is outputted, in response to a driving control signal that is enabled when the number of pulses of a read strobe signal, which are generated during a preset section, is equal to or more than a preset number; and
- a read control signal generation circuit configured to generate a read control signal for controlling a read operation from the read strobe signal in response to the supply voltage.

12. The semiconductor device of claim 11, wherein the power driving circuit comprises:
- a voltage dropping element coupled between the first and second nodes; and
- a short control element coupled between the first and second nodes, and turned on in response to the driving control signal.

13. The semiconductor device of claim 11, wherein the read control signal generation circuit comprises one or more buffers, and generates the read control signal by buffering the read strobe signal.

14. The semiconductor device of claim 13, wherein the buffer comprises:
- a pull-up element coupled between the supply voltage and an output node, and configured to pull-up drive the output node in response to a signal of an input node; and
- a pull-down element coupled between the output node and a ground voltage, and configured to pull-down drive the output node in response to the signal of the input node.

15. The semiconductor device of claim 11, wherein the read strobe signal contains pulses which are generated to perform a read operation.

16. The semiconductor device of claim 11, further comprising:
- a read data generation circuit configured to generate read data from input data in synchronization with a pulse contained in the read control signal; and
- a data latch circuit configured to latch the read data in response to an input/output control signal, and output the latched read data as output data.

17. A semiconductor device comprising:
- a driving control signal generation circuit configured to generate a driving control signal by determining whether one of a gapless active operation, a gapless write operation, and a gapless precharge operation is performed, according to a strobe signal;
- a power driving circuit configured to drive a supply voltage to a power supply voltage in response to the driving control signal; and
- a control signal generation circuit configured to generate a control signal for controlling an internal operation from the strobe signal in response to the supply voltage.

18. The semiconductor device of claim 17, wherein the strobe signal contains pulses which are generated to perform one of an active operation, a write operation, and a precharge operation.

19. The semiconductor device of claim 17, wherein the driving control signal generation circuit generates the driving control signal that is enabled when the number of pulses of the strobe signal, which are generated during a preset section, is equal to or more than a preset number.

20. The semiconductor device of claim 17, further comprising an operation control circuit configured to control one of an active operation, a write operation, and a precharge operation in response to the control signal.

* * * * *